(12) United States Patent
Partridge et al.

(10) Patent No.: US 7,760,513 B2
(45) Date of Patent: *Jul. 20, 2010

(54) MODIFIED CORE FOR CIRCUIT MODULE SYSTEM AND METHOD

(75) Inventors: Julian Partridge, Austin, TX (US); David Roper, Austin, TX (US); Paul Goodwin, Austin, TX (US)

(73) Assignee: Entorian Technologies LP, Austin, TX (US)

( * ) Notice: Subject to any disclaimer, the term of this patent is extended or adjusted under 35 U.S.C. 154(b) by 697 days.

This patent is subject to a terminal disclaimer.

(21) Appl. No.: 11/397,597

(22) Filed: Apr. 3, 2006

(65) Prior Publication Data

US 2006/0198238 A1  Sep. 7, 2006

Related U.S. Application Data

(63) Continuation-in-part of application No. 11/231,418, filed on Sep. 21, 2005, now Pat. No. 7,443,023, which is a continuation-in-part of application No. PCT/US2005/028547, filed on Aug. 10, 2005, and a continuation-in-part of application No. 11/068,688, filed on Mar. 1, 2005, now Pat. No. 7,324,352, which is a continuation-in-part of application No. 11/007,551, filed on Dec. 8, 2004, now Pat. No. 7,511,968, which is a continuation-in-part of application No. 10/934,027, filed on Sep. 3, 2004, application No. 11/397,597, which is a continuation-in-part of application No. 11/005,992, filed on Dec. 7, 2004, now Pat. No. 7,480,152, which is a continuation-in-part of application No. 10/934,027, application No. 11/397,597, which is a continuation-in-part of application No. 11/193,954, filed on Jul. 29, 2005, now abandoned, which is a continuation-in-part of application No. 11/007,551, application No. 11/397,597, and a continuation-in-part of application No. 11/123,721, filed on May 6, 2005, which is a continuation-in-part of application No. 11/068,688, and a continuation-in-part of application No. 11/005,992.

(51) Int. Cl.
H05K 1/11 (2006.01)
(52) U.S. Cl. .................. 361/803; 361/704; 361/767; 257/724
(58) Field of Classification Search ................. 361/803, 361/704, 705, 767; 257/724
See application file for complete search history.

(56) References Cited

U.S. PATENT DOCUMENTS 3,372,310 A  3/1968  Kantor (Continued)

FOREIGN PATENT DOCUMENTS

EP  122-687 A  10/1984

(Continued)

OTHER PUBLICATIONS

Complaint filed Mar. 8, 2007, in the United States District Court for the District of Massachusetts, Boston Division, Civil Action No. 07 CA 10468 DPW.

(Continued)

*Primary Examiner*—Dean A. Reichard
*Assistant Examiner*—Abiy Getachew
(74) *Attorney, Agent, or Firm*—Civins Denko Coburn & Lauff LLP (57) ABSTRACT

Flexible circuitry is populated with integrated circuitry (ICs) disposed along one or both of its major sides. The populated flexible circuitry is disposed proximal to a rigid substrate to place the integrated circuitry on one or both sides of the substrate with one or two layers of integrated circuitry on one or both sides of the substrate. The rigid substrate exhibits adhesion features that allow more advantageous use of thermoplastic adhesives with concomitant rework advantages and while providing flexibility in meeting dimensional specifications such as those promulgated by JEDEC, for example.

18 Claims, 10 Drawing Sheets

U.S. PATENT DOCUMENTS

| | | |
|---|---|---|
| 3,436,604 A | 4/1969 | Hyltin |
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik et al. |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,445,869 A * | 8/1995 | Ishikawa et al. ............ 428/209 |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |

| | | | | | | |
|---|---|---|---|---|---|---|
| 6,021,048 | A | 2/2000 | Smith | 6,486,544 | B1 | 11/2002 Hashimoto |
| 6,025,992 | A | 2/2000 | Dodge et al. | 6,489,687 | B1 | 12/2002 Hashimoto |
| 6,028,352 | A | 2/2000 | Eide | 6,502,161 | B1 | 12/2002 Perego et al. |
| 6,028,365 | A | 2/2000 | Akram et al. | 6,514,793 | B2 | 2/2003 Isaak |
| 6,034,878 | A | 3/2000 | Osaka et al. | 6,521,984 | B2 | 2/2003 Matsuura |
| 6,038,132 | A | 3/2000 | Tokunaga et al. | 6,528,870 | B2 | 3/2003 Fukatsu et al. |
| 6,040,624 | A | 3/2000 | Chambers et al. | 6,531,772 | B2 | 3/2003 Akram et al. |
| 6,049,975 | A | 4/2000 | Clayton | 6,544,815 | B2 | 4/2003 Isaak |
| 6,060,339 | A | 5/2000 | Akram et al. | 6,552,910 | B1 | 4/2003 Moon et al. |
| 6,072,233 | A | 6/2000 | Corisis et al. | 6,552,948 | B2 | 4/2003 Woo et al. |
| 6,078,515 | A | 6/2000 | Nielsen et al. | 6,560,117 | B2 | 5/2003 Moon |
| 6,084,294 | A | 7/2000 | Tomita | 6,566,746 | B2 | 5/2003 Isaak et al. |
| 6,091,145 | A * | 7/2000 | Clayton ............ 257/724 | 6,572,387 | B2 | 6/2003 Burns et al. |
| 6,097,087 | A | 8/2000 | Farnworth et al. | 6,573,593 | B1 | 6/2003 Syri et al. |
| 6,111,757 | A | 8/2000 | Dell et al. | 6,576,992 | B1 | 6/2003 Cady et al. |
| 6,121,676 | A | 9/2000 | Solberg | 6,588,095 | B2 | 7/2003 Pan |
| RE36,916 | E | 10/2000 | Moshayedi | 6,590,282 | B1 | 7/2003 Wang et al. |
| 6,157,541 | A | 12/2000 | Hacke | 6,600,222 | B1 | 7/2003 Levardo |
| 6,172,874 | B1 | 1/2001 | Bartilson | 6,614,664 | B2 | 9/2003 Lee |
| 6,178,093 | B1 | 1/2001 | Bhatt et al. | 6,627,984 | B2 | 9/2003 Bruce et al. |
| 6,180,881 | B1 | 1/2001 | Isaak | 6,629,855 | B1 | 10/2003 North et al. |
| 6,187,652 | B1 | 2/2001 | Chou et al. | 6,646,936 | B2 | 11/2003 Hamamatsu et al. |
| 6,205,654 | B1 | 3/2001 | Burns | 6,660,561 | B2 | 12/2003 Forthun |
| 6,208,521 | B1 | 3/2001 | Nakatsuka | 6,661,092 | B2 | 12/2003 Shibata et al. |
| 6,208,546 | B1 | 3/2001 | Ikeda | 6,677,670 | B2 | 1/2004 Kondo |
| 6,214,641 | B1 | 4/2001 | Akram | 6,683,377 | B1 | 1/2004 Shim et al. |
| 6,215,181 | B1 | 4/2001 | Akram et al. | 6,690,584 | B2 | 2/2004 Uzuka et al. |
| 6,215,687 | B1 | 4/2001 | Sugano et al. | 6,699,730 | B2 | 3/2004 Kim et al. |
| 6,222,737 | B1 | 4/2001 | Ross | 6,720,652 | B2 | 4/2004 Akram et al. |
| 6,222,739 | B1 | 4/2001 | Bhakta et al. | 6,721,181 | B1 | 4/2004 Pfeifer et al. |
| 6,225,688 | B1 | 5/2001 | Kim et al. | 6,721,185 | B2 | 4/2004 Dong et al. |
| 6,232,659 | B1 * | 5/2001 | Clayton ............ 257/724 | 6,721,226 | B2 | 4/2004 Woo et al. |
| 6,233,650 | B1 | 5/2001 | Johnson et al. | 6,744,656 | B2 | 6/2004 Sugano et al. |
| 6,234,820 | B1 | 5/2001 | Perino et al. | 6,751,113 | B2 | 6/2004 Bhakta et al. |
| 6,262,476 | B1 | 7/2001 | Vidal | 6,756,661 | B2 | 6/2004 Tsuneda et al. |
| 6,262,895 | B1 | 7/2001 | Forthun | 6,760,220 | B2 | 7/2004 Canter et al. |
| 6,265,660 | B1 | 7/2001 | Tandy | 6,762,942 | B1 | 7/2004 Smith |
| 6,266,252 | B1 | 7/2001 | Karabatsos | 6,768,660 | B2 | 7/2004 Kong et al. |
| 6,281,577 | B1 | 8/2001 | Oppermann et al. | 6,833,981 | B2 | 12/2004 Suwabe et al. |
| 6,288,907 | B1 | 9/2001 | Burns | 6,833,984 | B1 | 12/2004 Belgacem |
| 6,288,924 | B1 | 9/2001 | Sugano et al. | 6,839,266 | B1 | 1/2005 Garrett, Jr. et al. |
| 6,300,679 | B1 | 10/2001 | Mukerji et al. | 6,841,868 | B2 | 1/2005 Akram et al. |
| 6,316,825 | B1 | 11/2001 | Park et al. | 6,850,414 | B2 | 2/2005 Benisek et al. |
| 6,323,060 | B1 | 11/2001 | Isaak | 6,873,534 | B2 | 3/2005 Bhakta et al. |
| 6,336,262 | B1 | 1/2002 | Dalal et al. | 6,878,571 | B2 | 4/2005 Isaak et al. |
| 6,343,020 | B1 | 1/2002 | Lin et al. | 6,884,653 | B2 | 4/2005 Larson |
| 6,347,394 | B1 | 2/2002 | Ochoa et al. | 6,914,324 | B2 | 7/2005 Rapport et al. |
| 6,349,050 | B1 | 2/2002 | Woo et al. | 6,919,626 | B2 | 7/2005 Burns |
| 6,351,029 | B1 | 2/2002 | Isaak | 6,956,284 | B2 | 10/2005 Cady et al. |
| 6,357,023 | B1 | 3/2002 | Co et al. | 7,053,478 | B2 | 5/2006 Roper et al. |
| 6,358,772 | B2 | 3/2002 | Miyoshi | 7,094,632 | B2 | 8/2006 Cady et al. |
| 6,360,433 | B1 | 3/2002 | Ross | 7,180,167 | B2 | 2/2007 Partridge et al. |
| 6,368,896 | B2 | 4/2002 | Farnworth et al. | 7,393,226 | B2 | 7/2008 Clayton et al. |
| 6,370,668 | B1 | 4/2002 | Garrett, Jr. et al. | 7,394,149 | B2 | 7/2008 Clayton et al. |
| 6,376,769 | B1 | 4/2002 | Chung | 2001/0001085 | A1 | 5/2001 Hassanzadeh et al. |
| 6,392,162 | B1 | 5/2002 | Karabatsos | 2001/0006252 | A1 | 7/2001 Kim et al. |
| 6,404,043 | B1 | 6/2002 | Isaak | 2001/0013423 | A1 | 8/2001 Dalal et al. |
| 6,410,857 | B1 | 6/2002 | Gonya | 2001/0015487 | A1 | 8/2001 Forthun |
| 6,426,240 | B2 | 7/2002 | Isaak | 2001/0026009 | A1 | 10/2001 Tsuneda et al. |
| 6,426,549 | B1 | 7/2002 | Isaak | 2001/0028588 | A1 | 10/2001 Yamada et al. |
| 6,426,560 | B1 | 7/2002 | Kawamura et al. | 2001/0035572 | A1 | 11/2001 Isaak |
| 6,428,360 | B2 | 8/2002 | Hassanzadeh et al. | 2001/0040793 | A1 | 11/2001 Inaba |
| 6,433,418 | B1 | 8/2002 | Fujisawa et al. | 2001/0052637 | A1 | 12/2001 Akram et al. |
| 6,444,921 | B1 | 9/2002 | Wang et al. | 2002/0001216 | A1 | 1/2002 Sugano et al. |
| 6,446,158 | B1 | 9/2002 | Karabatsos | 2002/0006032 | A1 | 1/2002 Karabatsos |
| 6,449,159 | B1 | 9/2002 | Haba | 2002/0030995 | A1 | 3/2002 Shoji |
| 6,452,826 | B1 | 9/2002 | Kim et al. | 2002/0076919 | A1 | 6/2002 Peters et al. |
| 6,459,152 | B1 | 10/2002 | Tomita et al. | 2002/0094603 | A1 | 7/2002 Isaak |
| 6,462,412 | B2 | 10/2002 | Kamei et al. | 2002/0101261 | A1 | 8/2002 Karabatsos |
| 6,465,877 | B1 | 10/2002 | Farnworth et al. | 2002/0139577 | A1 | 10/2002 Miller |
| 6,465,893 | B1 | 10/2002 | Khandros et al. | 2002/0164838 | A1 | 11/2002 Moon et al. |
| 6,472,735 | B2 | 10/2002 | Isaak | 2002/0180022 | A1 | 12/2002 Emoto |
| 6,473,308 | B2 | 10/2002 | Forthun | 2002/0185731 | A1 | 12/2002 Akram et al. |

| | | |
|---|---|---|
| 2002/0196612 A1 | 12/2002 | Gall et al. |
| 2003/0002262 A1 | 1/2003 | Benisek et al. |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0109078 A1 | 6/2003 | Takahashi et al. |
| 2003/0116835 A1 | 6/2003 | Miyamoto et al. |
| 2003/0159278 A1 | 8/2003 | Peddle |
| 2003/0168725 A1 | 9/2003 | Warner et al. |
| 2004/0000708 A1 | 1/2004 | Rapport et al. |
| 2004/0012991 A1 | 1/2004 | Kozaru |
| 2004/0021211 A1 | 2/2004 | Damberg |
| 2004/0099938 A1 | 5/2004 | Kang et al. |
| 2004/0150107 A1 | 8/2004 | Cha et al. |
| 2004/0229402 A1 | 11/2004 | Cady et al. |
| 2004/0236877 A1 | 11/2004 | Burton |
| 2005/0082663 A1 | 4/2005 | Wakiyama et al. |
| 2005/0108468 A1 | 5/2005 | Hazelzet et al. |
| 2005/0133897 A1 | 6/2005 | Baek et al. |
| 2005/0242423 A1 | 11/2005 | Partridge et al. |
| 2005/0263911 A1 | 12/2005 | Igarashi et al. |
| 2006/0020740 A1 | 1/2006 | Bartley et al. |
| 2006/0050496 A1 | 3/2006 | Goodwin |
| 2006/0050497 A1 | 3/2006 | Goodwin |
| 2006/0053345 A1 | 3/2006 | Goodwin |
| 2006/0091529 A1 | 5/2006 | Wehrly et al. |
| 2006/0095592 A1 | 5/2006 | Borkenhagen |
| 2006/0111866 A1 | 5/2006 | LeClerg et al. |
| 2006/0125067 A1 | 6/2006 | Wehrly et al. |
| 2007/0211426 A1 | 9/2007 | Clayton et al. |
| 2007/0211711 A1 | 9/2007 | Clayton |
| 2007/0212906 A1 | 9/2007 | Clayton et al. |
| 2007/0212920 A1 | 9/2007 | Clayton et al. |
| 2008/0192428 A1 | 8/2008 | Clayton et al. |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 A | 6/1983 |
| JP | 3-102862 | 4/1991 |
| JP | 5-29534 A | 2/1993 |
| JP | 5-335695 A | 12/1993 |
| JP | 2821315 B2 | 11/1998 |
| JP | 2001/077294 A | 3/2001 |
| JP | 2001/085592 A | 3/2001 |
| JP | 2001/332683 A | 11/2001 |
| JP | 2002/009231 A | 1/2002 |
| JP | 2003/037246 A | 2/2003 |
| JP | 2003/086760 A | 3/2003 |
| JP | 2003/086761 A | 3/2003 |
| JP | 2003/309246 A | 10/2003 |
| JP | 2003/347503 A | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Letter dated Sep. 11, 2006, from Chris Karabatsos of Kentron Technologies to John Kelly, President of JEDEC Solid State Technology Association, concerning potential interferences involving U.S. Appl. No. 11/306,803.
U.S. Appl. No. 11/306,803, filed Jan. 11, 2006, Chris Karabatsos.
PCT/US05/28547 International Search Report and Written Opinion, PCT, Aug. 18, 2006.
PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.
PCT/US06/007193, International Search Report and Written Opinion, PCT, Nov. 7, 2007.
U.S. Appl. No. 10/934,027, filed Sep. 3, 2004.
U.S. Appl. No. 11/005,992, filed Dec. 7, 2004.
U.S. Appl. No. 11/007,551, filed Dec. 8, 2004.
U.S. Appl. No. 11/058,979, filed Feb. 16, 2005.
U.S. Appl. No. 11/068,688, filed Mar. 1, 2005.
U.S. Appl. No. 11/077,952, filed Mar. 11, 2005.
U.S. Appl. No. 11/123,721, filed May 6, 2005.
U.S. Appl. No. 11/124,506, filed May 6, 2005.
U.S. Appl. No. 11/125,018, filed May 9, 2005.
U.S. Appl. No. 11/131,835, filed May 18, 2005.
U.S. Appl. No. 11/157,565, filed Jun. 21, 2005.
U.S. Appl. No. 11/173,450, filed Jul. 1, 2005.
U.S. Appl. No. 11/187,269, filed Jul. 22, 2005.
U.S. Appl. No. 11/193,954, filed Jul. 29, 2005.
U.S. Appl. No. 11/231,418, filed Sep. 21, 2005.
U.S. Appl. No. 11/242,962, filed Oct. 4, 2005.
U.S. Appl. No. 11/255,061, filed Oct. 19, 2005.
U.S. Appl. No. 11/283,355, filed Nov. 18, 2005.
U.S. Appl. No. 11/331,969, filed Jan. 13, 2006.
U.S. Appl. No. 11/332,740, filed Jan. 13, 2006.
U.S. Appl. No. 11/364,489, filed Feb. 27, 2006.
U.S. Appl. No. 11/517,198, filed Sep. 7, 2006.
U.S. Appl. No. 11/564,199, filed Nov. 28, 2006.
U.S. Appl. No. 11/624,608, filed Jan. 18, 2007.
U.S. Appl. No. 11/668,416, filed Jan. 29, 2007.
U.S. Appl. No. 11/668,425, filed Jan. 29, 2007.
Pages 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Chip Scale Review Online —An Independent Journal Dedicated to the Advancement of Chip-Scale Electronics. (Website 9 pages) Fjelstad, Joseph, Pacific Consultants L.L.C., Published Jan. 2001 on the Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Introduces µZ ™—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the µZ™—Ball Stacked Memory Package. Published Jul. 17, 2002 in San Jose, CA.
Dense-Pac Microsystems, Breaking Space Barriers, 3-D Technology 1993.

* cited by examiner

MODIFIED CORE FOR CIRCUIT MODULE SYSTEM AND METHOD

RELATED APPLICATIONS

This application is a continuation-in-part of patent application Ser. No. 11/231,418, filed Sep. 21, 2005, now U.S. Pat. No. 7,443,023, which is a continuation-in-part of Pat. App. No. PCT/US05/28547 filed Aug. 10, 2005, pending, and a continuation-in-part of U.S. patent application Ser. No. 11/068,688 filed Mar. 1, 2005, now U.S. Pat. No. 7,324,352, which application is a continuation-in-part of U.S. patent application Ser. No. 11/007,551 filed Dec. 8, 2004, now U.S. Pat. No. 7,511,968, which application is a continuation-in-part of U.S. patent application Ser. No. 10/934,027 filed Sep. 3, 2004, pending. This application is also a continuation-in-part of U.S. patent application Ser. No. 11/005,992 filed Dec. 7, 2004, now U.S. Pat. No. 7,480,152, which application is a continuation-in-part of U.S. patent application Ser. No. 10/934,027 filed Sep. 3, 2004. This application is also a continuation-in-part of U.S. patent application Ser. No. 11/193,954 filed Jul. 29, 2005, now abandoned, which application is a continuation-in-part of U.S. patent application Ser. No. 11/007,551 filed Dec. 8, 2004 now U.S. Pat. No. 7,511,968. This application is also a continuation-in-part of U.S. patent application Ser. No. 10/934,027 filed Sep. 3, 2004, pending. This application is also a continuation-in-part of U.S. patent application Ser. No. 11/123,721 filed May 6, 2005, pending, which application is a continuation-in-part of both U.S. patent application Ser. No. 11/068,688 filed Mar. 1, 2005 now U.S. Pat. No. 7,324,352 and U.S. patent application Ser. No. 11/005,992 filed Dec. 7, 2004 now U.S. Pat. No. 7,480,152.

Patent application Ser. No. 11/231,418, filed Sep. 21, 2005; Pat. App. No. PCT/US05/28547; U.S. patent application Ser. No. 10/934,027; U.S. patent application Ser. No. 11/068,688; U.S. patent application Ser. No. 11/005,992; U.S. patent application Ser. No. 11/193,954; U.S. patent application Ser. No. 11/123,721; and U.S. patent application Ser. No. 11/007,551 are each hereby incorporated by reference herein.

FIELD

The present invention relates to systems and methods for improved attachment of flex circuitry to rigid substrate circuit module cores and, in particular, to such systems and methods for improved attachment of flex circuitry to rigid circuit module substrates.

BACKGROUND

Memory expansion is one of the many fields where high density circuit module solutions provide space-saving advantages. For example, the well-known DIMM (Dual In-line Memory Module) has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Typically, systems that employ DIMMs provide limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. That buffering function is provided by what is typically identified as the Advanced Memory Buffer or AMB. With the FB-DIMM, not only has capacity increased, pin count has declined to approximately 69 signal pins from the approximately 240 pins previously required.

There are several known methods to improve the limited capacity of a DIMM or other circuit board. In one strategy, for example, small circuit boards (daughter cards) are connected to the DIMM to provide extra mounting space. The additional connection may, however, cause flawed signal integrity for the data signals passing from the DIMM to the daughter card while the additional thickness of the daughter card(s) increases the profile of the module.

Multiple die packages (MDP) can also be used to increase DIMM capacity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another way to increase module capacity. Capacity is increased by stacking packaged integrated circuits to create a high-density circuit module for mounting on the larger circuit board. In some techniques, flexible conductors are used to selectively interconnect packaged integrated circuits.

The assignee of the present invention, Staktek Group L.P., has developed numerous configurations and methods for circuit modules devised for a variety of uses such as, for example, memory expansion or multi-function system on a stack applications. One particular family of such innovations employs a rigid substrate and IC-populated flex circuitry to construct space-saving and thermally-efficient modules that may be employed to supplant traditional DIMMs. Such modules are typically constructed by disposing flex circuitry about a rigid substrate while adhering the flex circuitry to the substrate with an adhesive or other laminating medium or method. In other modules, flex circuitry may be attached or adhered to package bodies. Because a variety of substrate materials and multiple ICs may be typically employed in such modules, methods and systems that provide specification compliance flexibility and rework opportunities are welcome in the art.

SUMMARY

Flexible circuitry is populated with integrated circuitry (ICs) disposed along one or both of its major sides. The populated flexible circuitry is disposed proximal to a rigid substrate to place the integrated circuitry on one or both sides of the substrate with one or two layers of integrated circuitry on one or both sides of the substrate. The rigid substrate exhibits adhesion features that allow more advantageous use of thermoplastic adhesives with concomitant rework advantages and while providing flexibility in meeting dimensional specifications such as those promulgated by JEDEC, for example.

DETAILED DESCRIPTION OF PREFERRED EMBODIMENTS

Figure 1:
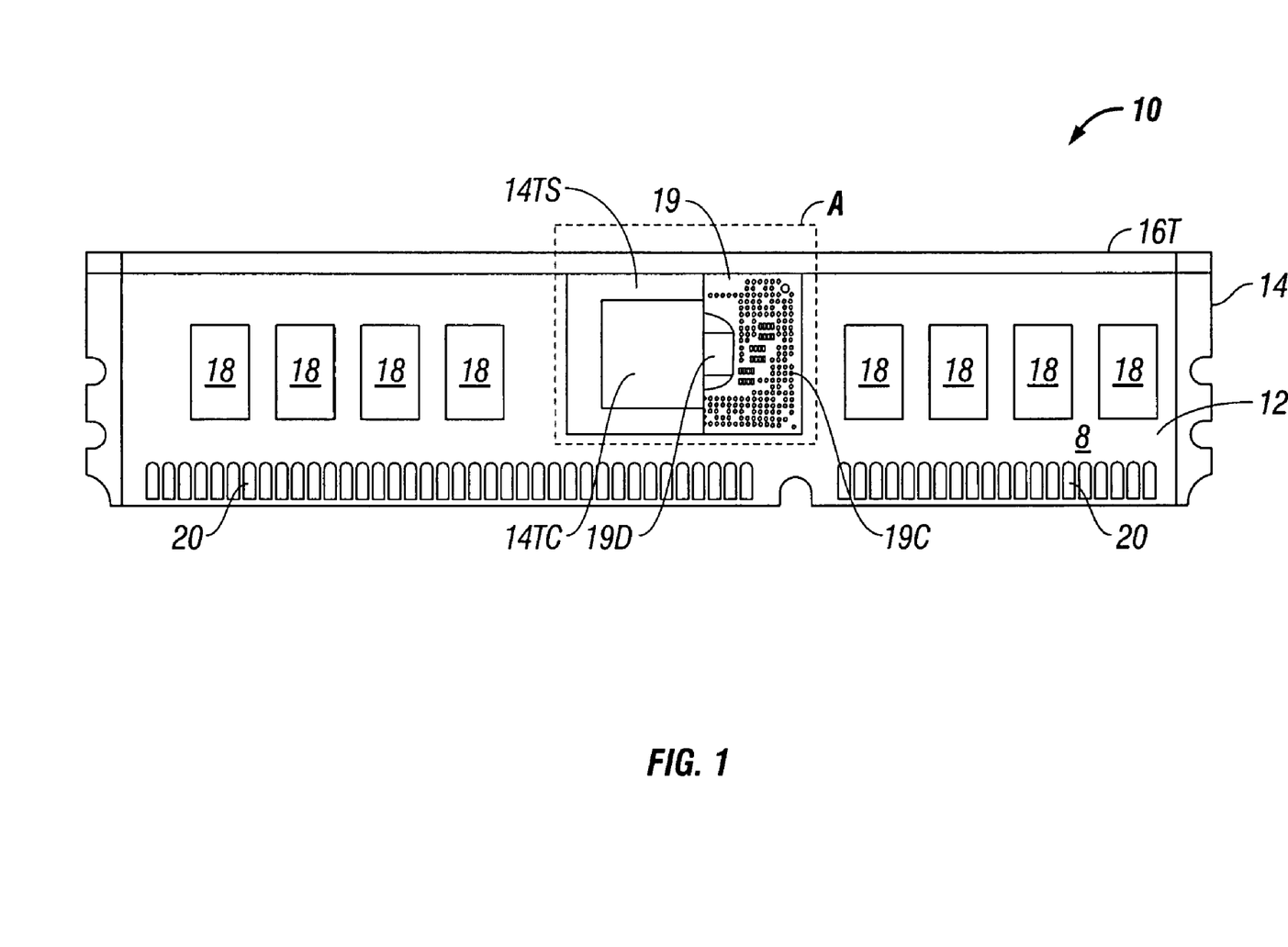
FIG. 1 depicts a module that may employ to advantage a preferred embodiment of the present invention. Certain cutaway areas expose internal construction details.

FIG. 1 depicts a module 10 devised in accordance with a preferred embodiment of the present invention. The depiction of FIG. 1 illustrates module 10 having substrate 14 about which is disposed flex circuit 12 populated with ICs 18 which are, in a preferred embodiment, memory devices in CSP packages. Flex circuit 12 is cutaway in area "A" to illustrate internal preferred features of module 10. Area "A" is shown in greater enlargement in later FIG. 3.

Within area A are seen thermal sink 14TS and beyond the cutaway section of thermal sink 14TS, there is shown a part of a circuit 19 which, in a preferred embodiment, is the well-known advanced memory buffer or AMB employed in FB-DIMM circuitry. AMB circuit 19 includes AMB die 19D and contacts 19C. A module in accordance with a preferred embodiment typically will exhibit plural CSPs of a first type, such as memory CSPs, for example, and will have at least one CSP of a second type, such as a microprocessor, graphics processor or buffer or, more particularly, an AMB, for example.

Thermal sink 14TS is comprised, in this preferred embodiment, from metallic material of high thermal conductivity such as, for example, copper or copper alloy and has, in this preferred embodiment, a central portion 14TC that is a copper field substantially larger than and preferably in thermal contact with AMB die 19D either directly or through thermally-conductive adhesive or a thermally-conductive gasket material, for example. Thermal contact with a part of circuit 19 should be considered thermal contact with circuit 19.

In this preferred embodiment, central portion 14TC of thermal sink 14TS is raised above the periphery of thermal sink 14TS and additionally provides on its other side, an indentation into which may be introduced at least a portion of AMB circuit 19 such as, for example, AMB die 19D, to assist in realization of a low profile for module 10. An indentation is not required however to practice the invention. In the preferred depicted embodiment, thermal sink 14TS is disposed over a window 250 through substrate 14. AMB circuit 19, which is mounted on the "inside" of flex circuit 12, is disposed, at least in part, into window 250 from the "back" side of substrate 14 to realize thermal contact with thermal sink 14TS to provide a conduit to reduce thermal energy loading of AMB circuit 19.

Thermal sink 14TS need not cover the entirety of window 250. In other embodiments, for example, thermal sink 14TS may merely be across the window 250 or thermal sink 14TS may be set into window 250 instead of over or across the opening of window 250. Thermal sink 14TS is typically a separate piece of metal from substrate 14 but, after appreciating this specification, those of skill will recognize that, in alternative instances, thermal sink 14TS may be integral with substrate 14 or a particular portion of substrate 14 may be constructed to be a thermal sink 14TS in accordance with the teachings herein. For example, substrate 14 may be comprised of aluminum, while a thermal sink area 14TS of substrate 14 may be comprised of copper yet substrate 14 and thermal sink 14TS are of a single piece. In a variation of the integral thermal sink-substrate embodiment, the thermal sink could be attached to the substrate without a window and thus be preferentially accessible only on one side of substrate 14. Construction expense will be more likely to militate against such construction but the principles of the invention encompass such constructions. Consequently, a window in substrate 14 is not required to practice some embodiments of the invention. Therefore, a thermal sink 14TS should be considered to be an area or element integral with or attached to a substrate 14 and the material from which that thermal sink is composed exhibits greater thermal conductivity than the material of the substrate. To continue the example, substrate 14 may be aluminum while thermal sink 14TS is comprised of copper.

Preferably, different materials are used for the thermal sink 14Ts as opposed to the substrate in general which result in the different thermal conductivity characteristics between substrate 14 and thermal sink 14TS. Another example could be a plastic bodied substrate 14 and a copper based thermal sink 14TS. Flex support 14FS is typically comprised of the same material as the bulk of substrate 14.

Where a window 250 in substrate 250 is employed, at least a part of thermal sink 14TS should be accessible through window 250 from the "other" side of substrate 14. AMB circuit 19 or other high heat circuit 19 and, in particular, AMB die 19D, may be disposed in or across or over window 250 and preferably, will be introduced into an indentation of thermal sink 14TS and disposed in thermal contact with thermal sink 14TS and, more preferably, with the central core 14TC of thermal sink 14TS (where a central core has been optionally included in thermal sink 14TS) either with direct contact or through thermal adhesives or glues. Other embodiments may include additional windows where other high heat circuits are employed on module 10. Still other embodiments may insert some or all of ICs 18 into cutout areas in substrate 14 as described in detail in U.S. patent application Ser. No. 11/005, 992 which has been incorporated by reference herein.

In a preferred embodiment, thermal sink 14TS covers window 250 (as further illustrated in later FIG. 4) on one side of substrate 14 while AMB circuit 19 is disposed, at least in part, into window 250 to realize contact between thermal sink 14TS and AMB circuit 19 and particularly AMB die 19D either directly or as mediated through a thermally-conductive adhesive or glue.

Figure 2:
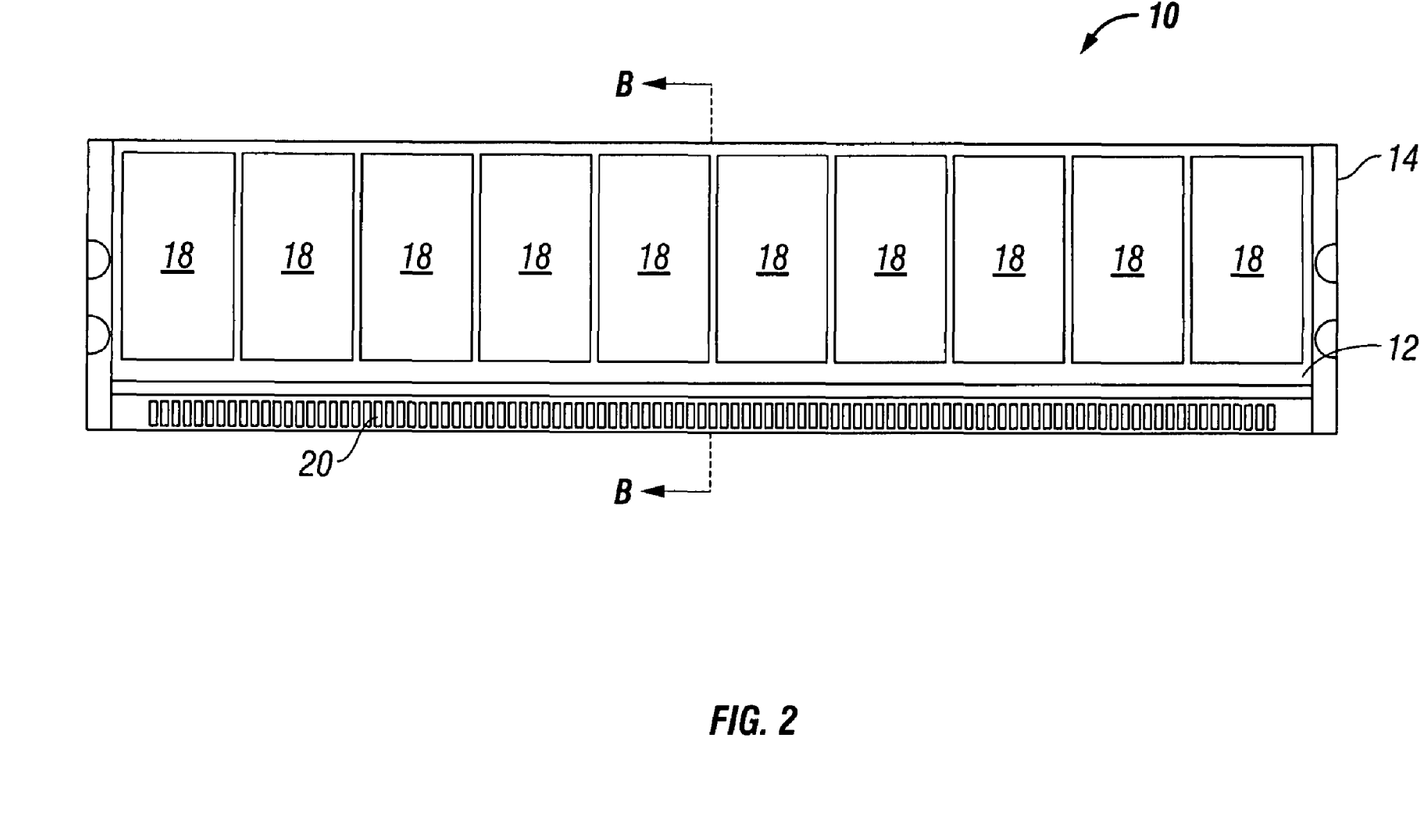
FIG. 2 is a plan view of a module in accordance with a preferred embodiment of the present invention.

FIG. 2 depicts module 10 with the aspect it would externally present without the cutaways of area "A" as exhibited in FIG. 1. As shown, module 10 will present an array of CSPs 18 along its exterior. Other embodiments may employ a variety of IC types including packaged and unpackaged circuitry. Closer inspection of an actual preferred module 10 would reveal that CSPs that were populated along an inner side 9 of flex circuit 12 are now disposed proximal to substrate 14 on the inner portion of module 10.

Figure 3:
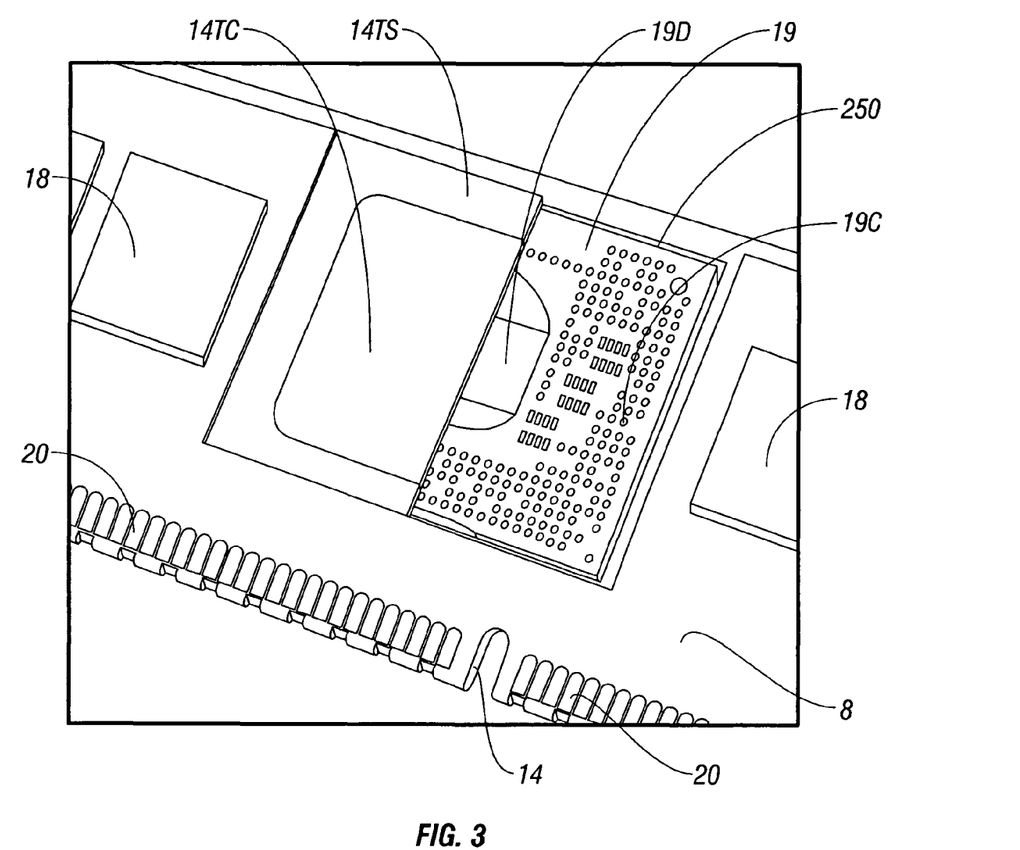
FIG. 3 is an enlarged depiction of the area marked "A" in FIG. 1.

FIG. 3 is an enlarged depiction of module 10 about the area marked "A" in FIG. 1. AMB circuit 19 is shown through window 250 through substrate 14. Preferably, AMB circuit 19 is mounted on what will become the internal side 9 of flex circuit 12 relative to module 10 and is, therefore, inserted into window 250 from the "rear" relative to the perspective shown in FIG. 3. Those of skill will recognize, particularly with reference to FIG. 3, that a portion of flex circuit 12 has been removed to expose thermal sink 14TS.

Preferably, substrate 14 is comprised of thermally conductive material. A metallic material with aluminum being readily manipulated for configuration as substrate 14 is a preferred choice. Carbon-based materials and certain plastics, for example, are known to readily conduct thermal energy and, as alternatives to metallic materials, such materials may be employed to advantage in preferred embodiments in accordance with the present invention where metallic materials are not available or wanted. Flex support 14FS is shown located near end 16A of substrate 14. Flex support 14FS provides physical support for flex circuit 12 when flex circuit 12 is disposed about end 16A. Flex support 14FS may be integral with or a separate piece from substrate 14.

Figure 4:
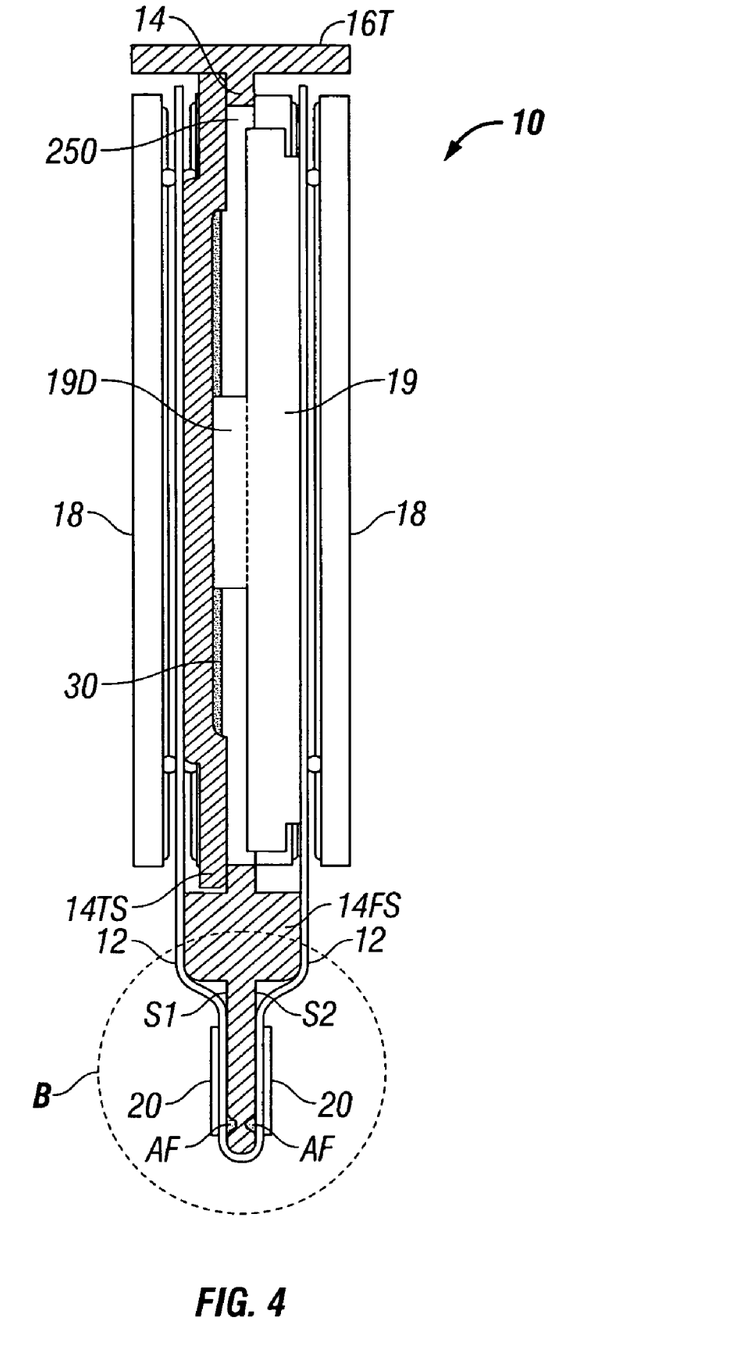
FIG. 4 is a cross-sectional view of a module devised in accordance with a preferred embodiment of the present invention.

FIG. 4 is a cross-sectional view of an exemplar module 10 taken along perspective line B-B of FIG. 2. FIG. 4 shows a substrate 14 with a window 250 through which thermal sink 14TS is accessible. Substrate 14 has first and second lateral sides identified as $S_1$ and $S_2$. As shown, substrate 14 exhibits one or more adhesion features AF which in the depicted embodiment are disposed proximal to an end of substrate 14. That end is identified in later Figs. as end 16A.

Adhesion features AF disposed near an end of substrate 14 provide space for adhesive and, therefore, provides flexibility in adhesive selection by allowing use of, for example, thermoplastic adhesives to adhere flex circuitry 12 to substrate 14. As those of skill will recognize, such adhesives allow rework opportunities that are not typically allowable when, for example, thermoset adhesives are employed. Adhesion features AF provide a migration space for adhesive when flex circuitry 12 is attached to substrate 14 as part of an assembly operation in constructing a circuit module 10 such as depicted exemplar module 10 shown in FIG. 4. When adhesion feature(s) AF are exhibited by substrate 14, excess thermoplastic adhesive may be employed in the adhesion operation. This has the added benefit of providing flexibility in meeting, for example, JEDEC specifications for connector thickness while still allowing use of such adhesives that have a tendency to flow when heated. Thus, when heated, excess adhesive will have a tendency to migrate to adhesive feature(s) AF rather than extruding out of the end of the flex fold area causing contamination.

Flex 12 is wrapped about substrate 14. As shown will be further shown, in this embodiment that realizes a FB-DIMM circuit, AMB circuit 19 is mounted on inner side 9 of flex circuit 12. When flex circuit 12 is disposed about substrate 14, AMB circuit 19 is introduced, at least in part, into window 250 with AMB die 19D extending further into said window 250 to realize thermal contact with thermal sink 14TS of substrate 14. That thermal contact is typically through thermally-conductive adhesive but, in alternative embodiments, another preferred construction would place AMB die 19D in direct physical contact with thermal sink 14TS to realize the thermal contact between AMB circuit 19 and thermal sink 14TS. Other thermal conduction enhancing materials may also be used in place of or addition to thermal adhesive such as for example, thermal grease or a thermal gasket.

Figure 5:
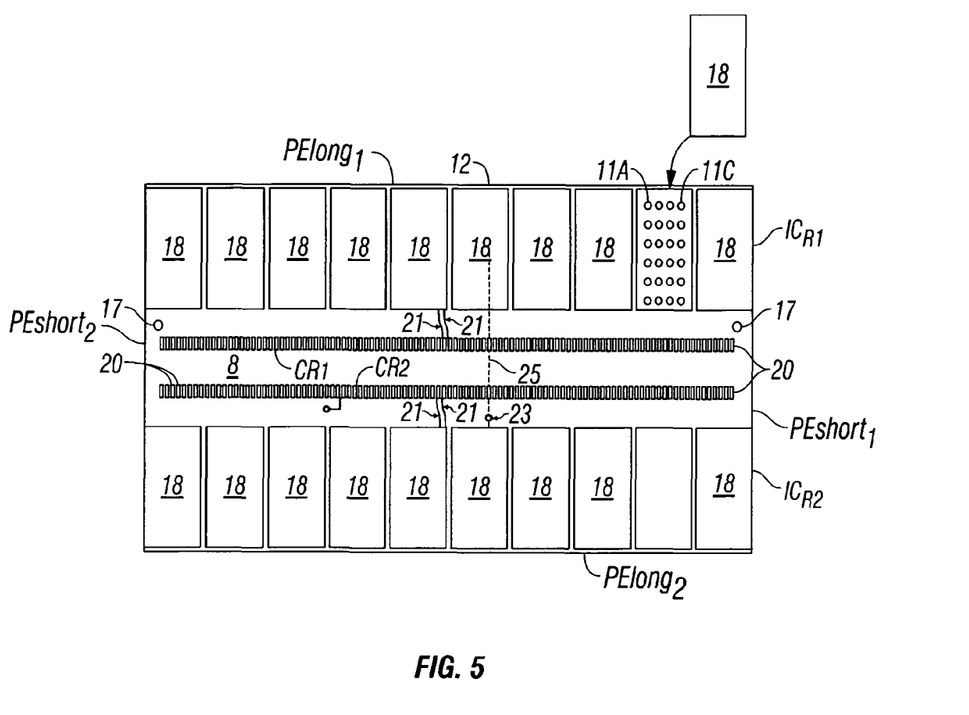
FIG. 5 depicts one side of a flex circuit employed in a preferred embodiment of the present invention.

FIG. 5 depicts a first side 8 of flex circuit 12 ("flex", "flex circuitry", "flexible circuit") used in constructing a module according to an embodiment of the present invention. Flex circuit 12 is preferably made from one or more conductive layers supported by one or more flexible substrate layers. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in this embodiment, chip-scale packaged memory devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Leaded or CSP devices or other devices in both packaged and unpackaged forms may be employed with embodiments of the depicted module and substrate bearing adhesion features AF, but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, stacks of ICs may also be employed where an IC 18 is indicated in the exemplar Figs. In some preferred embodiments, circuit 19 will be an AMB, but the principles of the invention may be employed with a variety of devices such as, for example, a microprocessor or graphics processor employed in a circuit module.

The depiction of FIG. 5 shows flex circuit 12 as having first and second fields of ICs 18 with one field of ICs 18 on each side of contacts 20. Those of skill will recognize that contacts 20 may appear on one or both sides of module 10 depending on the mechanical contact interface particulars of the application.

Flex circuit 12 may also referenced by its perimeter edges, two of which are typically long ($PE_{long1}$ and $PE_{long2}$) and two of which are typically shorter ($PE_{short1}$ and $PE_{short2}$) although flex circuit 12 may come in a variety of shapes including square. Contact arrays such as array 11A are disposed beneath ICs 18 and AMB circuit 19 and are comprised of array contacts 11C. An exemplar contact array 11A is shown as is exemplar IC 18 to be mounted at contact array 11A as depicted. The contact arrays 11A that correspond to an IC plurality may be considered a contact array set.

A first plurality of ICs 18 is shown on side 8 of flex circuit 12 and is identified as $IC_{R1}$ and a second plurality of CSPs is identified as $IC_{R2}$. Those of skill will recognize that the identified pluralities of CSPs are, when disposed in the configurations depicted, typically described as "ranks". Between the ranks $IC_{R2}$ and $IC_{R2}$, flex circuit 12 bears a plurality of module contacts allocated in this embodiment into two rows ($C_{R1}$ and $C_{R2}$) of module contacts 20. When flex circuit 12 is folded about substrate 14 as earlier depicted in, for example, FIG. 4, side 8 depicted in FIG. 5 is presented at the outside of module 10 and will be seen in views that correspond to FIG. 2. The opposing side 9 of flex circuit 12 is on the inside in several depicted configurations of module 10 and thus side 9 is closer to the substrate 14 about which flex circuit 12 is disposed than is side 8. Other embodiments may have other numbers of ranks and combinations of plural CSPs connected to create the module of the present invention.

FIG. 5 depicts an exemplar conductive trace 21 connecting row $C_{R2}$ of module contacts 20 to ICs 18. Those of skill will understand that there are many such traces in a typical embodiment. Traces 21 may also connect to vias that may transit to other conductive layers of flex 12 in certain embodiments having more than one conductive layer. In a preferred embodiment, vias connect ICs 18 on side 9 of flex 12 to module contacts 20. An example via is shown as reference 23. Traces 21 may make other connections between the ICs on either side of flex 12 and may traverse the rows of module contacts 20 to interconnect ICs. Together the various traces and vias make interconnections needed to convey data and control signals amongst the various ICs and buffer circuits. Those of skill will understand that the present invention may be implemented with only a single row of module contacts 20 and may, in other embodiments, be implemented as a module bearing ICs on only one side of flex circuit 12.

Figure 6:
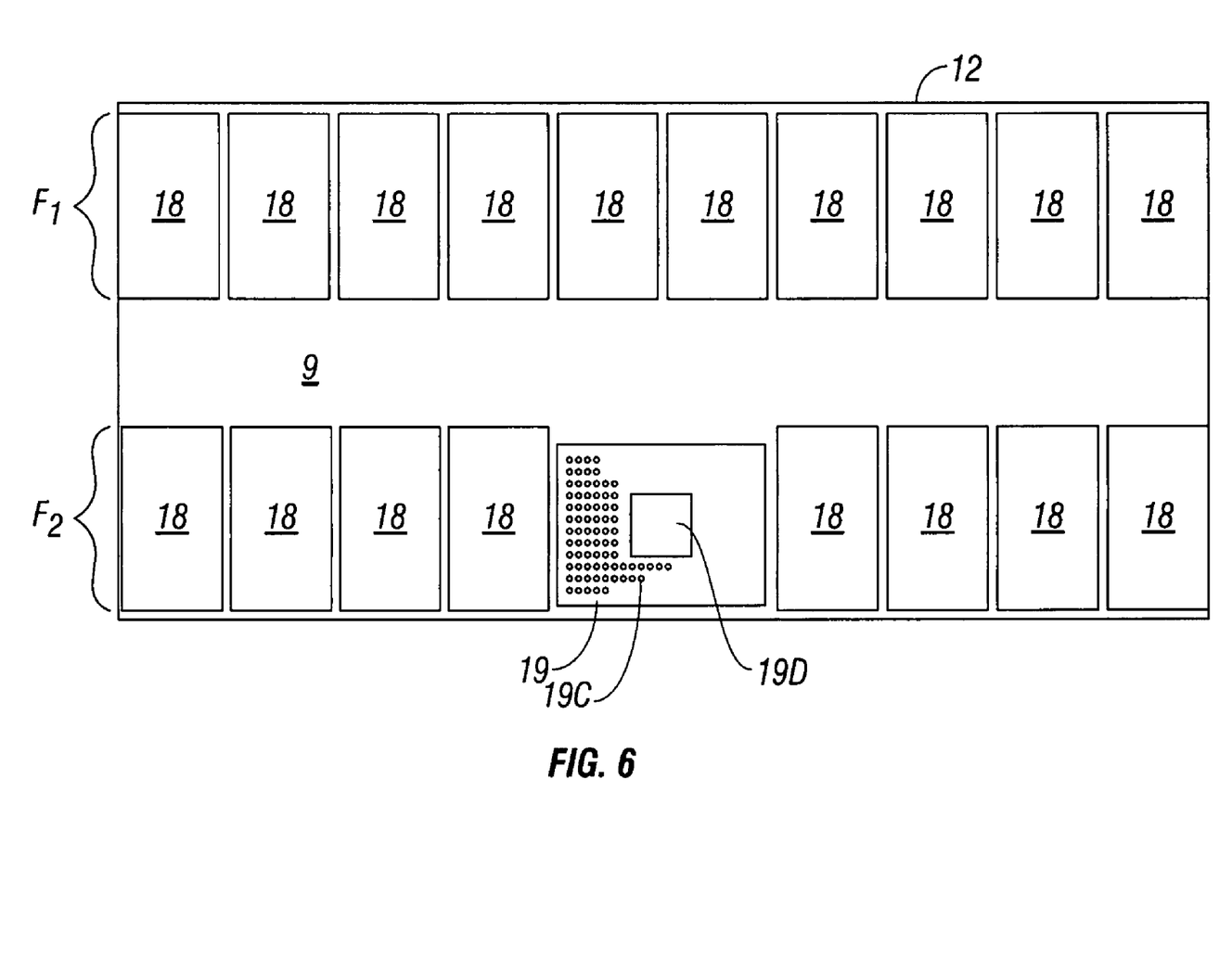
FIG. 6 depicts another side of the flex circuit depicted in FIG. 5.

FIG. 6 shows side 9 of flex circuit 12 depicting the other side of the flex circuit shown in FIG. 5. Side 9 of flex circuit 12 is shown as being populated with multiple CSPs 18 and AMB circuit 19. Side 9 includes fields F1 and F2 that each include at least one mounting contact array site for CSPs and, in the depicted case, include multiple contact arrays. Each of fields F1 and F2 include, in the depicted preferred embodiment, two pluralities of ICs identified in earlier FIG. 5 as $IC_{R1}$ and $IC_{R2}$. Other embodiments may also have fewer or greater numbers of ranks or pluralities of ICs in each field or on a side of a flex circuit.

Figure 7A:
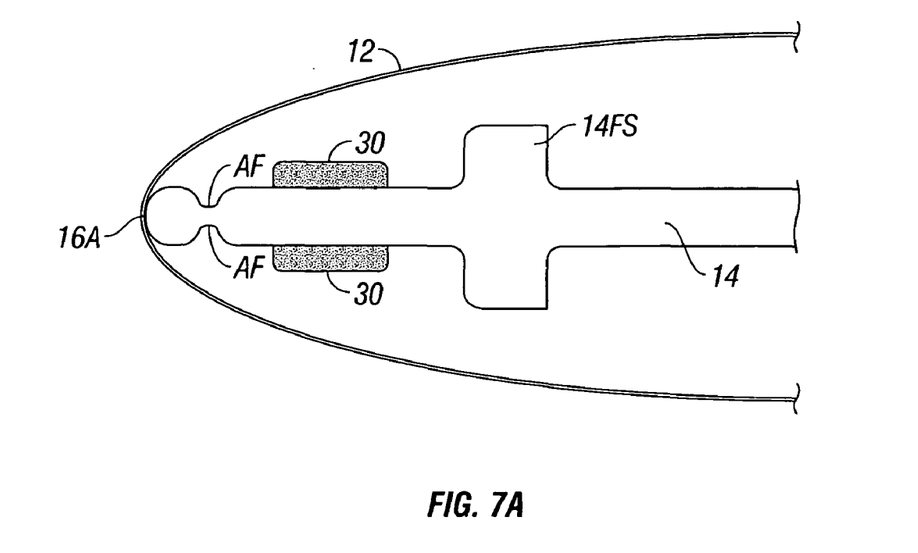
FIG. 7A depicts an area proximal to an end of a rigid substrate that exhibits adhesion features in accordance with a preferred embodiment of the present invention.
Figure 7B:
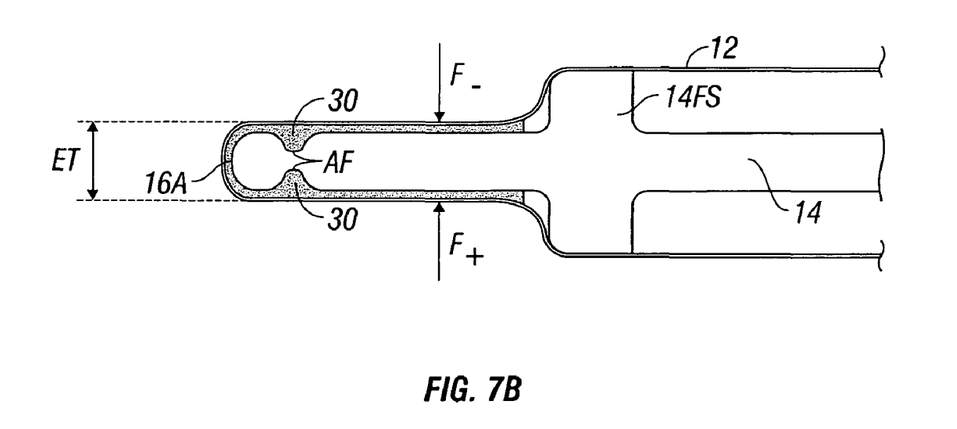
FIG. 7B is an enlarged view of a part of a circuit module with flex circuitry adhered to a rigid substrate in accordance with a preferred embodiment of the present invention.

FIG. 7A is an enlarged view of a portion of substrate 14 arranged with flex circuit 12 before attachment of flex circuit 12 to substrate 14. As shown, adhesion features AF are exhibited, in this example, by substrate 14 near end 16A and adhesive 30 is shown applied to selected locations on the sides of substrate 14. Preferably, adhesive 30 is a thermoplastic adhesive. FIG. 7B illustrates disposition of flex 12 about substrate 14 with adhesion features AF providing a space for excess amounts of adhesive 30 that migrate to adhesion features AF when pressure vectors F− and/or F+ are applied to flex circuit 12 either with or without heating. Contacts 20 are not shown for clarity of view. As depicted, edge thickness ET can, therefore, be controlled by varying the amount of pressure F−/F+ while adhesion features AF provide space for excess amounts of adhesive 30 as pressure F−/F+ increases, particularly with concomitant application of heat. Consequently, a specification for an edge card connector into which module 10 may be inserted can, for example, be more readily met with the use of adhesion features in a rigid substrate such as depicted substrate 14 without possible contamination by extrusion of excess adhesive from the interface between flex and substrate.

Figure 8:
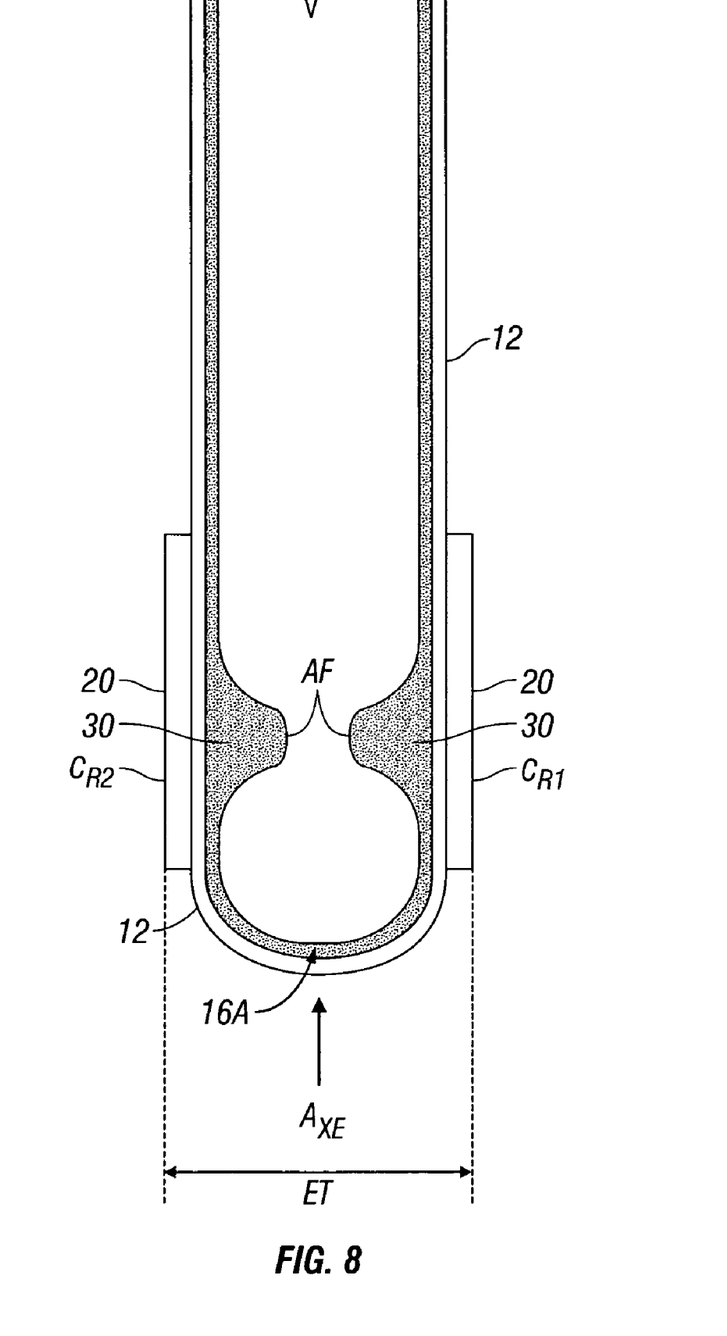
FIG. 8 is an enlarged view of the area of a preferred embodiment of a circuit module as marked "B" in FIG. 4.

FIG. 8 is an enlarged depiction of a part of the area of module 10 identified with "B" in FIG. 4 and shows adhesion features AF of substrate 14 being filled with adhesive 30. Those of skill will recognize that adhesion features AF may be configured to have various capacities and placed in various locations so that they are preferentially filled depending upon adhesive amounts and locations. As explained, edge thickness ET can be better controlled with the use of thermoplastic adhesive and adhesion features in substrate 14.

Figure 9:
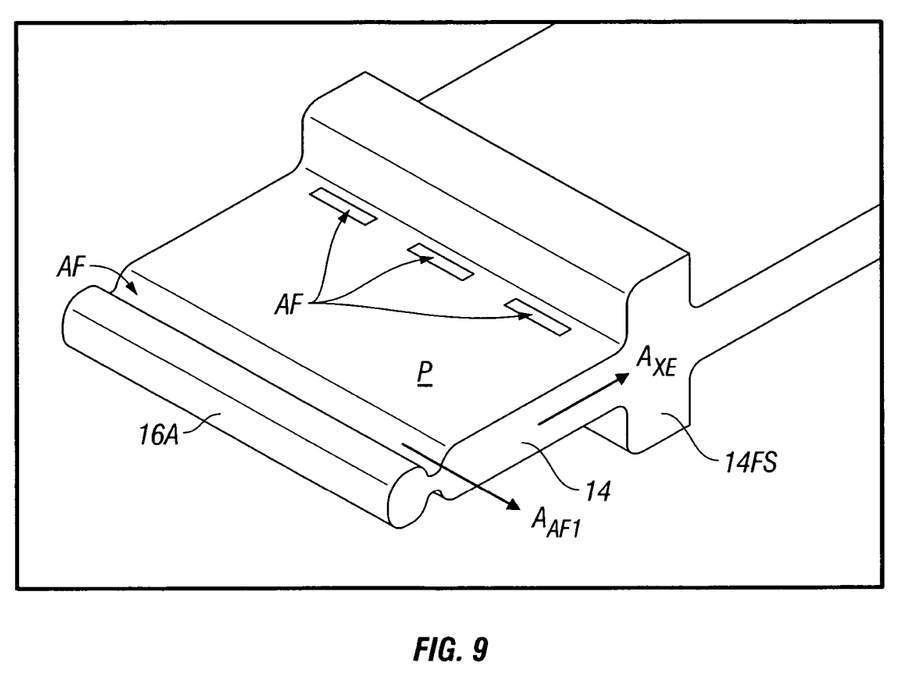
FIG. 9 depicts a portion of a rigid substrate that exhibits adhesion features in accordance with a preferred embodiment of the present invention.

FIG. 9 depicts an exemplar substrate 14 configured with adhesion features AF including one primary AF shown disposed proximal to end 16A. That AF is oriented along an axis $A_{AF1}$ that is perpendicular to long substrate axis Axe. Other adhesion features AF are shown proximal to flex support 14FS and are oriented with long axes perpendicular to long substrate axis Axe. As those of skill will recognize, substrate 14 typically has a plane P adjacent to which flex circuit 12 is disposed. Where a substrate such as the exemplar depicted substrate 14 provides a support for an IC-populated flex circuit, such as depicted flex circuit 12, as part of a circuit module, such as exemplar depicted module 10, an adhesion feature AF provides a depression in the plane P of substrate 14 so that excess amounts of adhesive employed to adhere the flexible circuitry to the substrate may preferentially migrate to the adhesion feature rather than extrude from the edges of the flex circuit when flex circuit 12 is fitted to substrate 14. Typically, adhesion feature AF will be covered by the flexible circuitry while providing the space for excess amounts of adhesive. Thus, excess adhesive may be employed between flex circuit 12 and substrate 14 thus providing the opportunity to selectively determine the edge thickness ET of module 10 while allowing use of thermoplastic adhesives that flow under heat but allow rework opportunities that are typically not available when using thermoset adhesives, for example.

Adhesion features may be devised in a variety of ways appropriate for the materials from which the substrate is fashioned. For example, substrates comprised of metallic materials may benefit from extrusion, milling or forging adhesive features into the substrate while other the use of other materials such as carbon based substrates may result in molding such features into the substrate although those of skill in the particular materials employed will be able to selected appropriate methods for the realization of adhesion features after appreciating this specification.

Figure 10:
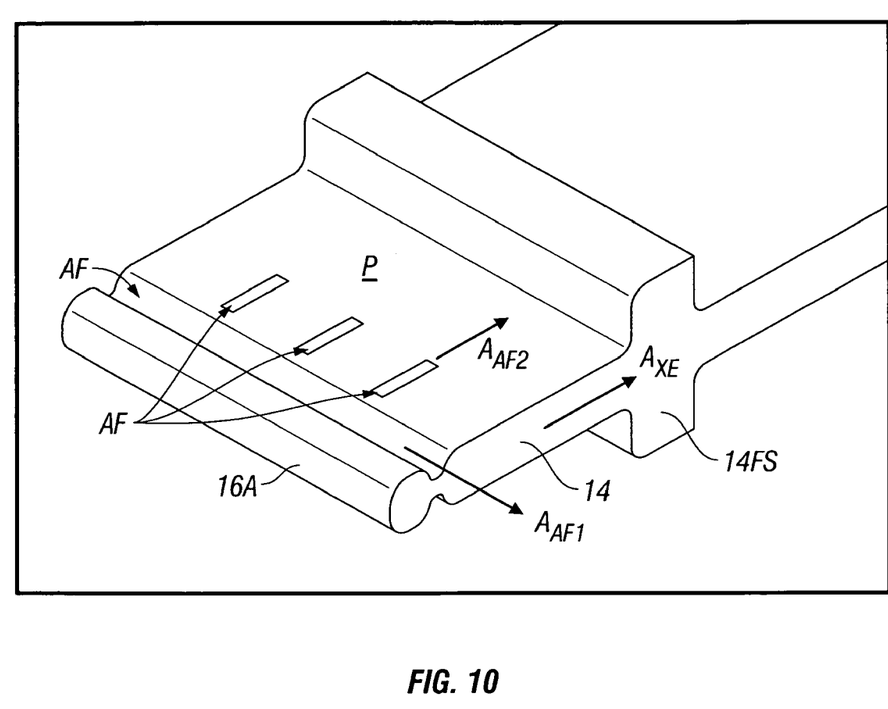
FIG. 10 depicts a portion of another rigid substrate that displays adhesion features in accordance with a preferred embodiment of the present invention.

FIG. 10 depicts another set of adhesion features AF with one such AF disposed along axis $A_{AF1}$, and another three adhesion features AF oriented with their axes $A_{AF2}$ parallel to long substrate axis Axe.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprising:
    (a) a rigid substrate having first and second opposing lateral sides, a long substrate axis and an edge, the rigid substrate exhibiting at least one primary adhesion feature depressed into the rigid substrate and oriented along an imaginary adhesion axis which is substantially perpendicularly to the long substrate axis; and
    (b) a flex circuit having first and second sides, the first side of the flex circuit having plural contacts adapted for connection of the circuit module to a circuit board socket and at least one of the first and second sides of the flex circuit being populated with plural memory ICs, the flex circuit being disposed about the edge of the rigid substrate covering the primary adhesion feature of the rigid substrate so that the primary adhesion feature is thus disposed between the flex circuit and the rigid substrate, the flex circuit being affixed to the rigid substrate with adhesive disposed in selected locations between the flex circuit and the rigid substrate.

2. The circuit module of claim 1 in which the flex circuit is further populated with an AMB.

3. The circuit module of claim 1 in which the adhesion feature contains an amount of the adhesive.

4. The circuit module of claim 1 in which the at least one primary adhesion feature is located proximal to the edge of the rigid substrate.

5. The circuit module of claim 1 in which the rigid substrate is comprised of metallic material.

6. The circuit module of claim 1 or 5 in which the rigid substrate is comprised of aluminum.

7. The circuit module of claim 1 in which the circuit module is devised for insertion into an edge card connector.

8. The circuit module of claim 1 in which the rigid substrate exhibits at least one secondary adhesion feature over which the flex circuit is disposed.

9. The circuit module of claims 1, 2, 3, 4 or 5 in which the adhesive is thermoplastic adhesive.

10. The circuit module of claim 1 in which there is at least one secondary adhesion feature not oriented parallel to the primary adhesion feature axis.

11. The circuit module of claim 1 in which there is at least one secondary adhesion feature oriented parallel to the primary adhesion feature axis.

12. A circuit module comprising:
   a rigid substrate comprised of metallic material, the rigid substrate exhibiting one or more adhesion features which are depressions in the rigid substrate;
   a flex circuit populated with ICs, the flex circuit being disposed about the rigid substrate to cover the one or more adhesion features of the rigid substrate so that the one or more adhesion features are disposed between the flex circuit and the rigid substrate and the flex circuit is attached to the rigid substrate with thermoplastic adhesive.

13. The circuit module of claim 12 in which excess amounts of the thermoplastic adhesive are disposed in at least one of the one or more adhesion features.

14. The circuit module of claim 12 in which the rigid substrate is comprised of metallic material.

15. The circuit module of claim 14 in which the rigid substrate is comprised of aluminum.

16. The circuit module of claim 12 further comprising an AMB.

17. The circuit module of claim 16 further comprising a thermal sink.

18. A method for assembly of a circuit module comprising:
   populating a flex circuit with plural ICs;
   providing a rigid substrate comprised of metallic material, the rigid substrate having at least one adhesion feature set into it so as to be exhibited as a depression in the rigid substrate;
   applying thermoplastic adhesive at selected locations of the rigid substrate;
   disposing the flex circuit about the rigid substrate so that the flex circuit covers the at least one adhesion feature and the flex circuit contacts the applied thermoplastic adhesive; and
   applying pressure to at least one selected area of the flex circuit where the flex circuit contacts the applied thermoplastic adhesive to cause the flex circuit to be adhered to the rigid substrate.

* * * * *

UNITED STATES PATENT AND TRADEMARK OFFICE
CERTIFICATE OF CORRECTION

PATENT NO. : 7,760,513 B2
APPLICATION NO. : 11/397597
DATED : July 20, 2010
INVENTOR(S) : Julian Partridge et al.

Page 1 of 1

It is certified that error appears in the above-identified patent and that said Letters Patent is hereby corrected as shown below:

On the Title Page (63), please delete "Continuation-in-part of application No. 11/231,418, filed on Sep. 21, 2005, now Pat. No. 7,443,023, which is a continuation-in-part of application No. PCT/US2005/028547, filed on Aug. 10, 2005, and a continuation-in-part of application No. 11/068,688, filed on Mar. 1, 2005, now Pat. No. 7,324,352, which is a continuation-in-part of application No. 11/007,551, filed on Dec. 8, 2004, now Pat. No. 7,511,968, which is a continuation-in-part of application No. 10/934,027, filed on Sep. 3, 2004, application No. 11/397,597, which is a continuation-in-part of application No. 11/005,992, filed on Dec. 7, 2004, now Pat. No. 7,480,152, which is a continuation-in-part of application No. 10/934,027, application No. 11/397,597, which is a continuation-in-part of application No. 11/193,954, filed on Jul. 29, 2005, now abandoned, which is a continuation-in-part of application No. 11/007,551, application No. 11/397,597, and a continuation-in-part of application No. 11/123,721, filed on May 6, 2005, which is a continuation-in-part of application No. 11/068,688, and a continuation-in-part of application No. 11/005,992."

and insert --Continuation-in-part of application No. 11/231,418, filed on Sep. 21, 2005, now Pat. No. 7,443,023, which is a continuation-in-part of application No. PCT/US2005/028547, filed on Aug. 10, 2005, now expired, and a continuation-in-part of application No. 11/068,688, filed on Mar. 1, 2005, now Pat. No. 7,324,352, which is a continuation-in-part of application No. 11/007,551, filed on Dec. 8, 2004, now Pat. No. 7,511,968, which is a continuation-in-part of application No. 10/934,027, filed on Sep. 3, 2004, now abandoned; application No. 11/397,597 is also a continuation-in-part of application No. 11/005,992, filed on Dec. 7, 2004, now Pat. No. 7,480,152, which is a continuation-in-part of application No. 10/934,027, filed on Sep. 3, 2004, now abandoned; application No. 11/397,597 is also a continuation-in-part of application No. 11/193,954, filed on Jul. 29, 2005, now abandoned, which is a continuation-in-part of application No. 11/007,551, filed Dec. 8, 2004, now Pat. No. 7,511,968; application No. 11/397,597 is also a continuation-in-part of application No. 10/934,027, filed Sep. 3, 2004, now abandoned; application No. 11/397,597 is also a continuation-in-part of application No. 11/123,721, filed on May 6, 2005, now abandoned, which is a continuation-in-part of application No. 11/068,688, filed Mar. 1, 2005, now Pat. No. 7,324,352 and is a continuation-in-part of application No. 11/005,992, filed Dec. 7, 2004, now Pat. No. 7,480,152.--

Signed and Sealed this
Twenty-ninth Day of October, 2013

Teresa Stanek Rea
*Deputy Director of the United States Patent and Trademark Office*